(12) United States Patent
   Izumi et al.

(10) Patent No.: US 12,586,982 B2
(45) Date of Patent: Mar. 24, 2026

(54) WAVELENGTH TUNABLE LASER DEVICE

(71) Applicant: Fujitsu Optical Components Limited, Kawasaki (JP)

(72) Inventors: Hirotomo Izumi, Kawasaki (JP); Suguru Akiyama, Kawasaki (JP); Ayahito Uetake, Atsugi (JP); Seimi Sasaki, Sagamihara (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 632 days.

(21) Appl. No.: 18/065,954

(22) Filed: Dec. 14, 2022

(65) Prior Publication Data

US 2023/0238774 A1      Jul. 27, 2023

(30) Foreign Application Priority Data

Jan. 26, 2022    (JP) ................................. 2022-009906

(51) Int. Cl.
   *H01S 3/10*       (2006.01)
   *H01S 5/026*      (2006.01)
   *H01S 5/10*       (2021.01)
   *H01S 5/14*       (2006.01)
   *H01S 5/50*       (2006.01)
   *H01S 5/02*       (2006.01)

(52) U.S. Cl.
   CPC ............ *H01S 5/1014* (2013.01); *H01S 5/026* (2013.01); *H01S 5/1003* (2013.01); *H01S 5/101* (2013.01); *H01S 5/1032* (2013.01); *H01S 5/141* (2013.01); *H01S 5/142* (2013.01); *H01S 5/50* (2013.01); *H01S 5/5045* (2013.01); *H01S 5/021* (2013.01)

(58) Field of Classification Search
   CPC ...... H01S 5/1014; H01S 5/026; H01S 5/1003; H01S 5/101; H01S 5/1032; H01S 5/141; H01S 5/142; H01S 5/50; H01S 5/5045; H01S 5/021
   See application file for complete search history.

(56) References Cited

U.S. PATENT DOCUMENTS 9,825,429  B1 *  11/2017  Norberg ................. H04B 10/66
   2009/0225801  A1 *  9/2009  Mori ......................... H01S 5/14
                                                              385/14
   2017/0040775  A1 *  2/2017  Takabayashi ............. H01S 5/50
   2018/0226767  A1 *  8/2018  Takabayashi ......... G01J 1/4257
                        (Continued)

FOREIGN PATENT DOCUMENTS

JP         2018-046144 A        3/2018

OTHER PUBLICATIONS

Naoki Kobayashi et al.; "Silicon Photonic Hybrid Ring-Filter External Cavity Wavelength Tunable Lasers"; Journal of Lightwave Technology, vol. 33, No. 6, Mar. 15, 2015; 0733-8724 2014 IEEE; downloaded Dec. 17, 2021; 1241-1246; (6 pages).

*Primary Examiner* — Kinam Park
(74) *Attorney, Agent, or Firm* — STAAS & HALSEY LLP

(57)         ABSTRACT

A wavelength tunable laser device includes: a first mirror; a second mirror; an optical amplifier provided between the first mirror and the second mirror; a wavelength tunable filter provided between the first mirror and the second mirror; and an optical waveguide coupling the optical amplifier and the wavelength tunable filter. The optical waveguide includes a first waveguide formed with a first width and a second waveguide formed with a second width wider than the first width.

9 Claims, 14 Drawing Sheets

(56)                    References Cited

U.S. PATENT DOCUMENTS

2019/0089132 A1*    3/2019   Soda ........................ H01S 5/142
2020/0358248 A1*   11/2020   Kurczveil ........... H01S 3/08031
2021/0091529 A1*    3/2021   Siriani ..................... G02B 6/12
2021/0294038 A1*    9/2021   Oka ..................... G02B 6/2813
2023/0113820 A1*    4/2023   Canoglu .............. H01S 5/0014
                                                     356/4.01

* cited by examiner

ENLARGEMENT

WAVEGUIDE IN OPTICAL AMPLIFIER 11          13

WAVELENGTH TUNABLE LASER DEVICE

CROSS-REFERENCE TO RELATED APPLICATION

This application is based upon and claims the benefit of priority of the prior Japanese Patent Application No. 2022-009906, filed on Jan. 26, 2022, the entire contents of which are incorporated herein by reference.

FIELD

The embodiments discussed herein are related a wavelength tunable laser device.

BACKGROUND

As one of optical devices for realizing large-capacity optical communication, a wavelength tunable laser device has been widely used. In addition, silicon photonics that realizes a high-density optical integrated circuit using a complementary metal oxide semiconductor (CMOS) technology has been attracting attention.

The wavelength tunable laser device includes, for example, an amplifier and an external resonator. When silicon photonics is used, the external resonator is configured by a silicon optical integrated circuit including a silicon waveguide. Here, since the silicon waveguide has a high refractive index, the optical length (alternatively, the optical path length) can be lengthened. Therefore, in the wavelength tunable laser device in which the external resonator is formed by the silicon optical integrated circuit, the spectral width of the output light can be narrowed while downsizing of the device is realized. Note that a wavelength tunable laser device including an external resonator is described in, for example, Japanese Laid-open Patent Publication No. 2018-046144 A and N. Kobayashi, K. Sato et al, Silicon Photonic Hybrid Ring-Filter External Cavity Wavelength Tunable Lasers, JOURNAL OF LIGHTWAVE TECHNOLOGY, VOL. 33, NO. 6, P1241-PP1246, Mar. 15, 2015.

In order to transmit a high-quality multi-level optical signal, laser light having a narrow spectral width is required. Here, in order to generate laser light having a narrow spectral width, it is preferable to make the optical length of the cavity longer. On the other hand, a plurality of weak spectra called a "longitudinal mode" appear in the cavity. The longitudinal mode appears at wavelength spacing that is inversely proportional to the optical length of the cavity. Therefore, when the optical length of the cavity is increased in order to narrow the spectral width of the laser light, the wavelength spacing of the longitudinal mode is smaller, and the longitudinal mode is likely to exist near the oscillation wavelength. Then, when light unnecessary for oscillation is generated in the cavity, energy may be transferred to a longitudinal mode appearing near the oscillation wavelength due to a phenomenon called "mode hop". That is, the longitudinal mode may be amplified. As a result, the oscillation of the laser becomes unstable, and the quality of the laser light is deteriorated.

SUMMARY

According to an aspect of the embodiments, a wavelength tunable laser device includes: a first mirror; a second mirror; an optical amplifier provided between the first mirror and the second mirror; a wavelength tunable filter provided between the first mirror and the second mirror; and an optical waveguide coupling the optical amplifier and the wavelength tunable filter. The optical waveguide includes a first waveguide formed with a first width and a second waveguide formed with a second width wider than the first width.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
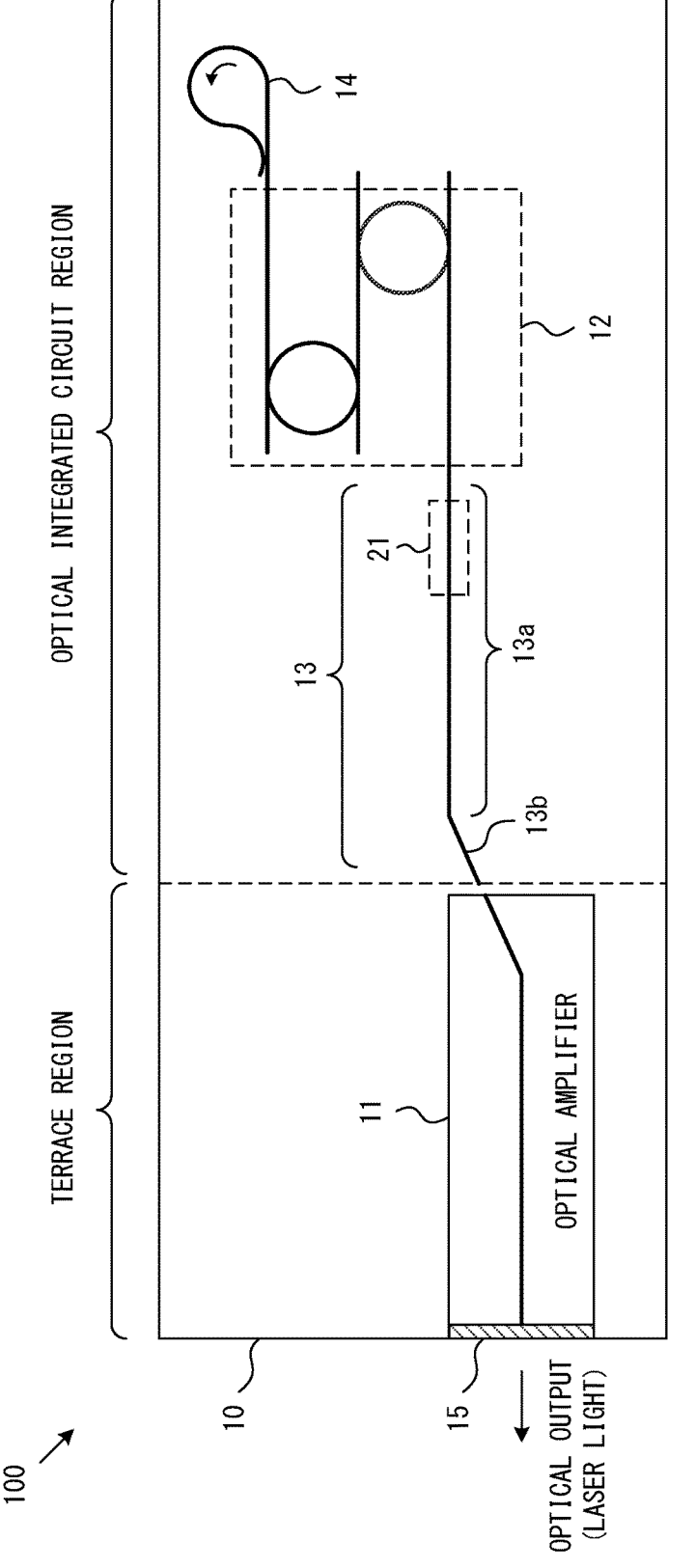
FIG. 1 illustrates an example of a wavelength tunable laser device.

FIG. 1 illustrates an example of a wavelength tunable laser device. The wavelength tunable laser device 100 illustrated in FIG. 1 is formed on a silicon substrate 10. That is, the wavelength tunable laser device 100 is formed using silicon photonics technology. Note that the shape of the silicon substrate 10 is rectangular in this embodiment.

The wavelength tunable laser device 100 includes an optical amplifier 11, a wavelength tunable filter 12, an optical waveguide 13, a mirror 14, and a mirror 15. Note that the wavelength tunable laser device 100 may include other elements not illustrated in FIG. 1. For example, the wavelength tunable laser device 100 includes an electric circuit (for example, an electrode) for supplying a drive current to the optical amplifier 11. In addition, the wavelength tunable laser device 100 also includes an electric circuit (for example, a heater) for controlling the wavelength of the laser light and an electric circuit (for example, a heater) for adjusting the optical length of the cavity.

As illustrated in FIG. 1, the silicon substrate 10 includes an optical integrated circuit region and a terrace region. In the optical integrated circuit region, the wavelength tunable filter 12, the optical waveguide 13, and the mirror 14 are formed by silicon photonics technology. The terrace region is formed by processing or etching the surface of the silicon substrate 10 by a specified depth. Then, the optical amplifier 11 is provided in the terrace region.

The optical amplifier 11 is, for example, a semiconductor optical amplifier. The optical amplifier 11 is implemented at a specified position in the terrace region in a manner that the electrode of the optical amplifier 11 is electrically connected to an electrode pattern (not illustrated) formed in the terrace region.

The wavelength tunable filter 12 includes a ring waveguide and can select a desired wavelength. In the example illustrated in FIG. 1, the wavelength tunable filter 12 includes two ring waveguides, but the embodiment of the present invention is not limited to this configuration. That is, the wavelength tunable filter 12 may include one ring waveguide or three or more ring waveguides. Note that, in a case where the wavelength tunable filter 12 includes a plurality of ring waveguides, the plurality of ring waveguides preferably have diameters slightly different from each other. In this case, the plurality of ring waveguides works as a vernier type tunable filter. However, in the drawings of the present application, the ring waveguides are illustrated with the same diameter for convenience. The configuration of the wavelength tunable filter 12 will be described later with reference to FIGS. 3A and 3B.

The optical waveguide 13 optically couples the optical amplifier 11 and the wavelength tunable filter 12. Here, the optical waveguide 13 includes a straight waveguide 13a and an inclined waveguide 13b formed in the longitudinal direction of the silicon substrate 10. Note that, in FIG. 1, the straight waveguide 13a and the inclined waveguide 13b are connected at a specified angle, but it is preferable to be connected continuously by a bent waveguide having a minute curvature. The inclined waveguide 13b is provided to prevent light propagating through the optical waveguide 13 from being perpendicularly incident on the end surfaces of both elements between the optical amplifier 11 and the optical integrated circuit. With this configuration, reflection of light incident on/emitted from the optical waveguide 13 to the optical amplifier 11 is suppressed. Note that the waveguides in the optical amplifier 11 are coupled to the optical waveguide 13 with a sufficiently small loss. In addition, a spot size converter is preferably formed at a tip end portion (in FIG. 1, inclined waveguide 13b) of the optical waveguide 13 coupled to the optical amplifier 11.

The optical waveguide 13 is realized by, for example, a silicon waveguide formed on the surface of the silicon substrate 10. The shape of the cross section of the core of the optical waveguide 13 is, for example, rectangular. The height of the core is, for example, 220 nm. In this case, the width of the core of the optical waveguide 13 is determined such that multimode propagation is sufficiently suppressed. As an example, the width of the core of the optical waveguide 13 is about 500 nm. Note that when the width of the core of the optical waveguide is 500 nm or less, multimode propagation is sufficiently suppressed.

Figure 2:
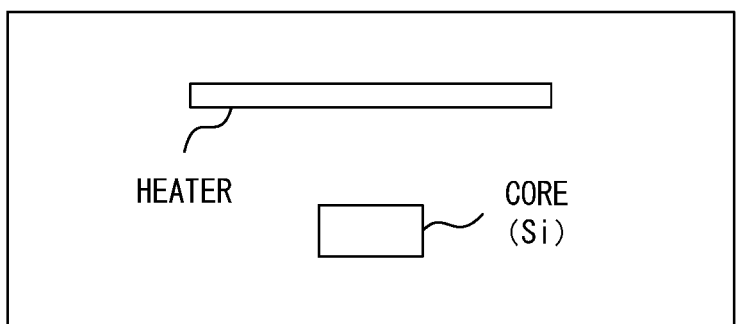
FIG. 2 illustrates an example of arrangement of a waveguide and a heater.

A heater 21 is provided near the optical waveguide 13. The heater 21 is realized by, for example, an electric circuit formed near the optical waveguide 13. For example, as illustrated in FIG. 2, the heater 21 is realized by forming a thin film metal such as TiN on the upper portion of the waveguide core having a width of 500 nm along the waveguide core with a width wider than the waveguide core. In this case, the electric circuit includes an electrode pattern formed near the optical waveguide 13 and a terminal connected to the electrode pattern. In this configuration, by controlling the current supplied to heater 21, the refractive index of optical waveguide 13 changes. That is, by controlling the current supplied to the heater 21, the optical length of the optical waveguide 13 is adjusted, and the resonator length of the wavelength tunable laser device 100 is adjusted. Therefore, the heater 21 can operate as a phase adjuster that adjusts the phase of light propagating in the wavelength tunable laser device 100.

The mirror 14 is optically coupled to an output end of the wavelength tunable filter 12. Therefore, the light output from the tunable filter 12 is reflected by the mirror 14 and the reflected light is input to the wavelength tunable filter 12. The mirror 14 is a total reflection mirror, and preferably has a loss close to 0. In addition, the mirror 14 is not particularly limited, but is realized by a loop mirror in this embodiment. The loop mirror is realized by an optical waveguide.

The mirror 15 is provided at the emission end of the wavelength tunable laser device 100. That is, the mirror 15 is provided on the emission surface of the optical amplifier 11. In addition, the mirror 15 is a half mirror (that is, the semi-transparent mirror). Therefore, the mirror 15 emits a part of the light component amplified in the optical amplifier 11 and reflects the remaining light component. Note that the reflectance (or transmittance) of mirror 15 is configured such that wavelength tunable laser device 100 generates the laser light with high efficiency.

In the wavelength tunable laser device 100 having the above configuration, light is generated by the optical amplifier 11 by driving the optical amplifier 11. Then, the light generated by the optical amplifier 11 propagates between the mirrors 14 and 15. That is, the light output from the optical amplifier 11 is guided to the wavelength tunable filter 12 via the optical waveguide 13. The light passing through the wavelength tunable filter 12 is reflected by the mirror 14 and returns to the wavelength tunable filter 12. The light passing through the wavelength tunable filter 12 is guided to the optical amplifier 11 via the optical waveguide 13. The light input from the optical waveguide 13 to the optical amplifier 11 is reflected by the mirror 15 and output to the optical waveguide 13.

During this operation, the wavelength tunable filter 12 allows light having a designated wavelength to pass through. Therefore, the light of the designated wavelength is propagated between the mirrors 14 and 15. In addition, the phase of light propagating through the optical waveguide 13 is adjusted by controlling the current supplied to the heater 21. Therefore, the light having the same phase is generated. That is, laser light is generated. Further, the laser light is amplified by the optical amplifier 11. Then, a part of the laser light passes through the mirror 15. Therefore, the wavelength tunable laser device 100 can generate laser light having a desired wavelength.

Figure 3A:
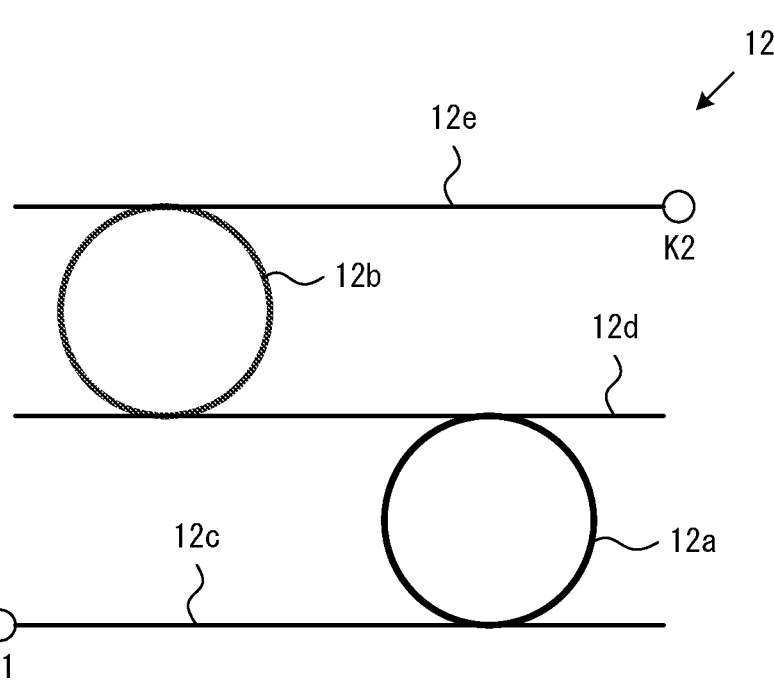
FIGS. 3A and 3B illustrate an example of a configuration of a wavelength tunable filter.
Figure 3B:
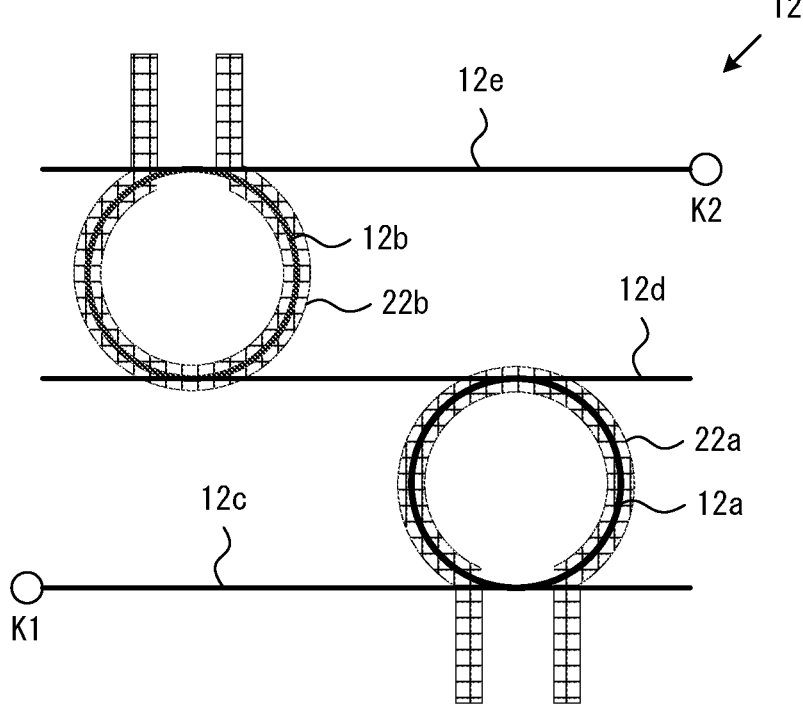

FIGS. 3A and 3B illustrate an example of a configuration of the wavelength tunable filter 12. In this embodiment, the wavelength tunable filter 12 includes ring waveguides 12a and 12b and waveguides 12c to 12e as illustrated in FIG. 3A. The waveguide 12c is optically coupled to optical waveguide 13 illustrated in FIG. 1. Note that waveguide 12c may be a part of optical waveguide 13. In this case, the wavelength tunable filter 12 includes the ring waveguides 12a and 12b and the waveguides 12d and 12e. The ring waveguide 12a is optically coupled to the waveguide 12c. The waveguide 12d is optically coupled to the ring waveguide 12a. That is, the ring waveguide 12a is coupled to the waveguide 12c and the waveguide 12d, respectively. The ring waveguide 12b is optically coupled to the waveguide 12d. The waveguide 12e is optically coupled to the ring waveguide 12b. That is, the ring waveguide 12b is coupled to the waveguide 12d and the waveguide 12e, respectively. The waveguide 12e is optically coupled to the mirror 14 illustrated in FIG. 1.

In the wavelength tunable filter 12 illustrated in FIGS. 3A and 3B, light input from an optical port K1 is guided to an optical port K2 via the waveguide 12c, the ring waveguide 12a, the waveguide 12d, the ring waveguide 12b, and the waveguide 12e. Therefore, light input from optical waveguide 13 illustrated in FIG. 1 to wavelength tunable filter 12 propagates through the waveguide 12c, the ring waveguide 12a, the waveguide 12d, the ring waveguide 12b, and the waveguide 12e, and is guided to the mirror 14 illustrated in FIG. 1.

The mirror 14 reflects light output from the optical port K2 of the wavelength tunable filter 12. The reflected light is input to the optical port K2 of the wavelength tunable filter 12. The light input from the optical port K2 is guided to the optical port K1 via the waveguide 12e, the ring waveguide 12b, the waveguide 12d, the ring waveguide 12a, and the waveguide 12c. Therefore, the reflected light from the mirror 14 propagates through the waveguide 12e, the ring waveguide 12b, the waveguide 12d, the ring waveguide 12a, and the waveguide 12c to the optical waveguide 13.

Note that the optical ports K1 and K2 in FIGS. 3A and 3B are illustrated to describe the configuration and operation of the wavelength tunable filter 12, and the wavelength tunable filter 12 does not include a physical "port". That is, the waveguide 12c and the optical waveguide 13 illustrated in FIG. 1 are preferably realized by continuous optical waveguides. In addition, the waveguide 12e and the mirror 14 illustrated in FIG. 1 are preferably realized by continuous optical waveguides.

Here, as illustrated in FIG. 3B, the wavelength tunable filter 12 includes heaters 22a and 22b near the ring waveguides 12a and 12b, respectively. The cross-sectional structure of this portion is substantially the same as the structure illustrated in FIG. 2. That is, on the upper portion of each ring waveguide core, a thin film metal is formed along the ring waveguide core. The heaters 22a and 22b are realized by electrode patterns formed near the ring waveguides 12a and 12b, respectively. In this configuration, by controlling the current supplied to the heaters 22a and 22b, the refractive indexes of the ring waveguides 12a and 12b are changed, and the optical lengths of the ring waveguides 12a and 12b are adjusted, respectively. In other words, the resonance wavelengths of the ring waveguides 12a and 12b can be adjusted using the heaters 22a and 22b. During this operation, light having a wavelength corresponding to the resonance wavelength is selected and output. Therefore, the ring waveguides 12a and 12b and the heaters 22a and 22b can operate as a wavelength selector to select light of a desired wavelength.

As described above, the wavelength tunable laser device 100 illustrated in FIG. 1 can generate laser light having a desired wavelength. However, in the configuration illustrated in FIG. 1, unnecessary light is generated in the cavity, and a mode hop may occur due to the unnecessary light. Then, when the mode hop occurs, the oscillation of the laser becomes unstable, and the quality of the laser light is deteriorated.

Regarding this problem, the inventors of the present application have found that one of the causes of generation of the unnecessary light is reflection (or scattering) in the optical waveguide. Hereinafter, reflection in the optical waveguide will be described with reference to FIGS. 4A and 4B.

Figures 4A, 4B:
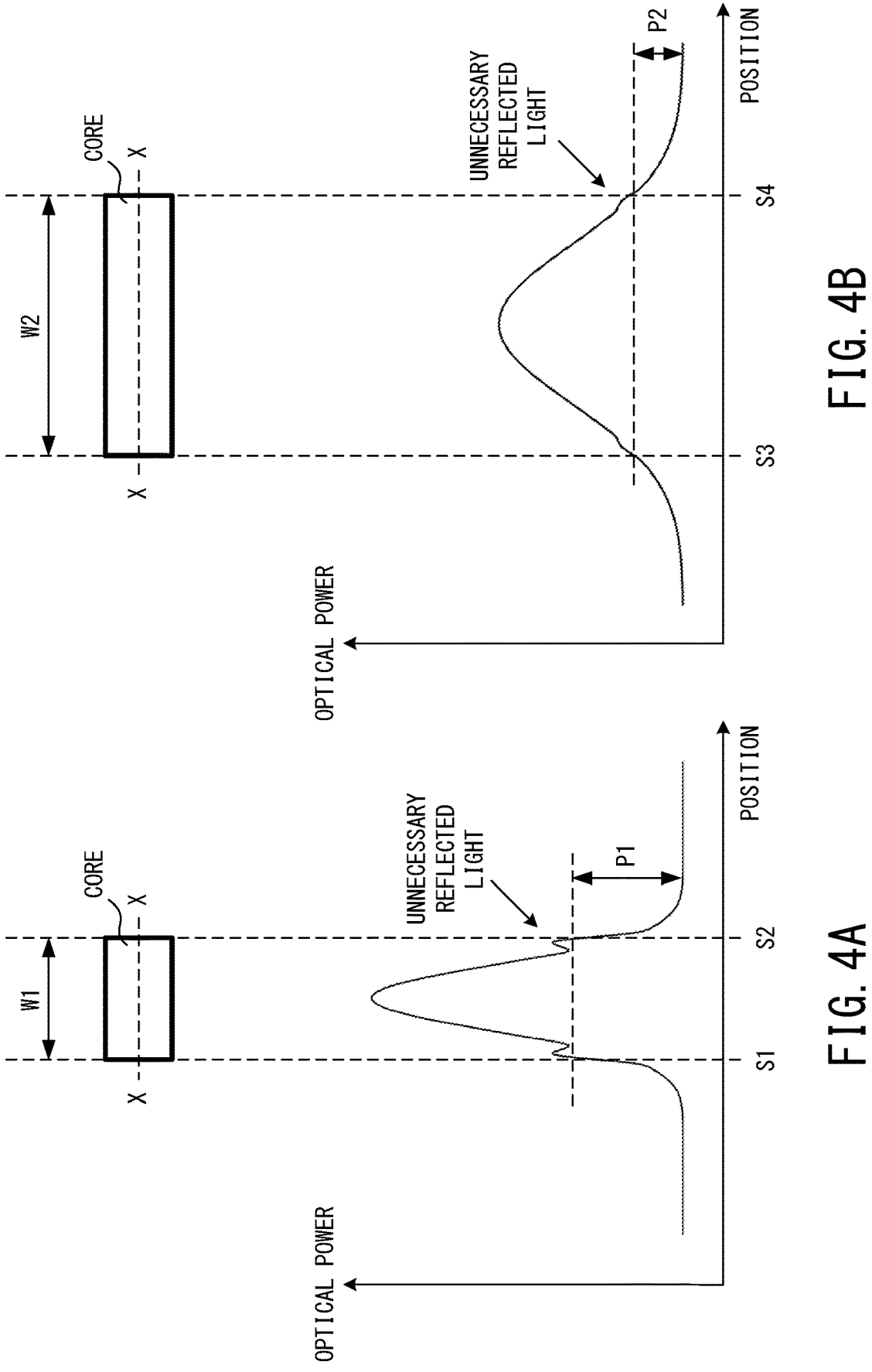
FIGS. 4A and 4B illustrate distribution of optical power in an optical waveguide.

The graphs illustrated in FIGS. 4A and 4B represent distribution of optical power in an optical waveguide. The horizontal axis represents the position on the X-X line across the core of the optical waveguide. The X-X line is parallel to the surface of the silicon substrate 10. The vertical axis of the graphs represents optical power. Note that the power of the light input to the optical waveguide is the same in the case illustrated in FIG. 4A and the case illustrated in FIG. 4B. In addition, the height of the core of the optical waveguide is the same in the case illustrated in FIG. 4A and the case illustrated in FIG. 4B.

In the case illustrated in FIG. 4A, the optical waveguide is formed to suppress multimode propagation. That is, a width W1 of the core is designed such that multimode propagation is suppressed. As an example, the width W1 of the core is about 500 nm.

The optical power is the highest near the center of the core. As the distance from the center of the core increases, the optical power decreases. However, in the case illustrated in FIG. 4A, the width W1 of the core is narrow. Therefore, an optical power P1 on the side wall (that is, positions S1 and S2) of the core is relatively large. On the other hand, it is difficult to completely smooth the side wall (that is, the boundary between the core and the cladding) of the core. When the side wall of the core is not smooth, random reflection occurs for light propagating in the core. Here, the higher the power of the light in contact with the side wall of the core, the stronger the reflected light. That is, the higher the power of the light in contact with the side wall of the core, the higher the power of the unnecessary reflected light. Therefore, as illustrated in FIG. 4A, when the width W1 of the core is narrow, the power of unnecessary reflected light becomes high.

In the case illustrated in FIG. 4B, a width W2 of the core is wider than the width W1 illustrated in FIG. 4A. As an example, the width W2 of the core is about 2 μm. Therefore, optical power P2 on the side wall (that is, positions S3 and S4) of the core is sufficiently small. Therefore, even when the side wall of the core is not smooth, reflected light for light propagating through the core is weak. Therefore, as illustrated in FIG. 4B, when the width W2 of the core is wide, the power of the unnecessary reflected light decreases.

Therefore, in the embodiment of the present invention, the core width of at least a part of the section of the optical waveguide 13 coupling the optical amplifier 11 and the wavelength tunable filter 12 is widened. Specifically, a core width of at least some sections of the optical waveguide 13 is formed wider than a waveguide width (for example, 500 nm) in which multimode propagation is suppressed. Thus, as described with reference to FIGS. 4A and 4B, generation of unnecessary reflected light in the optical waveguide 13 is suppressed. As a result, since the mode hop is less likely to occur and the oscillation of the laser is stabilized, the quality of the laser light is improved. Note that, although the risk of multimode propagation increases by increasing the width of the core of the optical waveguide, the embodiment of the present invention is configured to suppress the occurrence of multimode, which will be described later.

Figure 5:
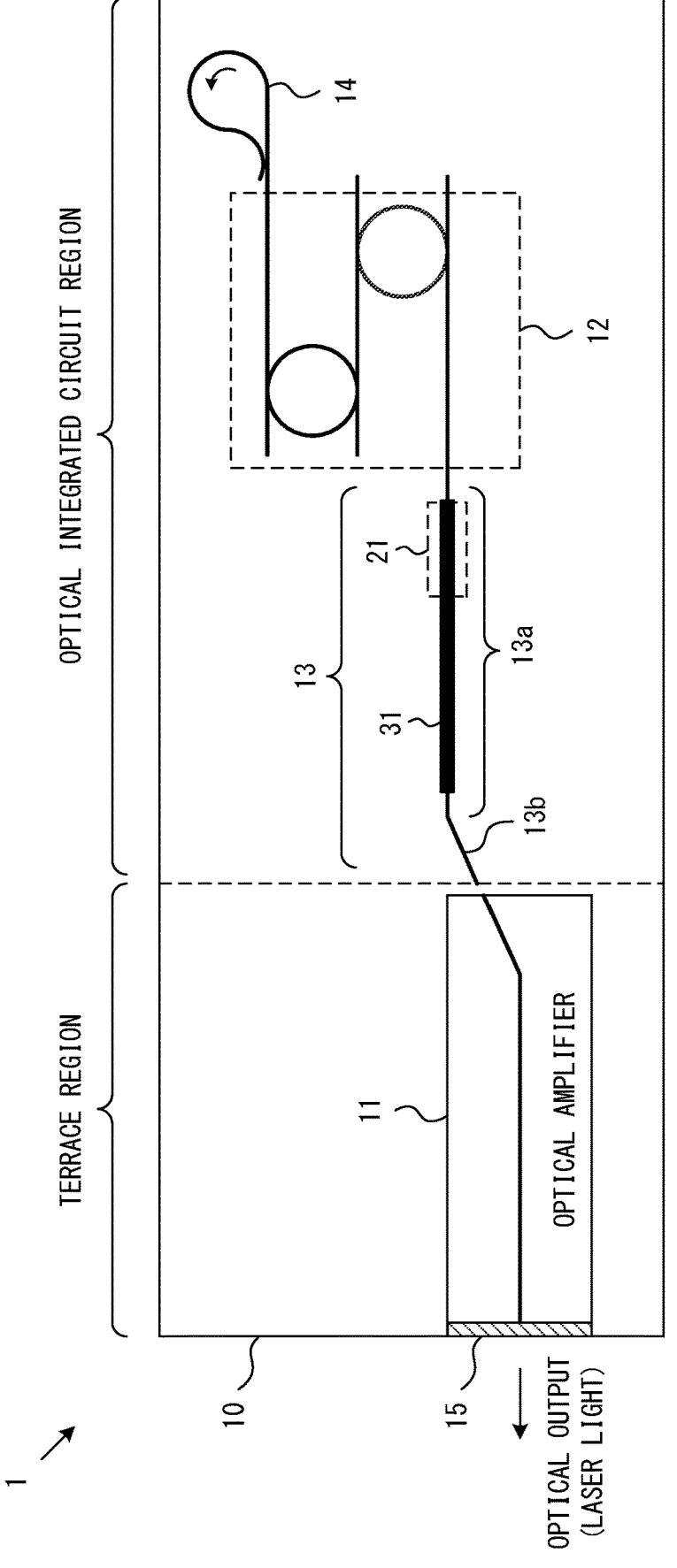
FIG. 5 illustrates a first embodiment of the wavelength tunable laser device.

FIG. 5 illustrates a first embodiment of the wavelength tunable laser device. The configuration of a wavelength tunable laser device 1 according to the first embodiment is substantially the same as that of the wavelength tunable laser device 100 illustrated in FIG. 1. However, the configuration of the optical waveguide 13 is different between the wavelength tunable laser device 100 illustrated in FIG. 1 and the wavelength tunable laser device 1 illustrated in FIG. 5.

In the wavelength tunable laser device 1, the optical waveguide 13 includes a wide-width waveguide 31. Specifically, the optical waveguide 13 includes the straight waveguide 13*a*, and the straight waveguide 13*a* includes a first waveguide in which a core is formed with a first width and a second waveguide in which a core is formed with a second width wider than the first width. Note that the wide-width waveguide 31 illustrated in FIG. 5 corresponds to the second waveguide. In addition, a waveguide portion of the straight waveguide 13*a* other than the wide-width waveguide 31 corresponds to the first waveguide.

As described above, in the wavelength tunable laser device 1, the optical waveguide 13 coupling the optical amplifier 11 and the wavelength tunable filter 12 includes the wide-width waveguide 31. Here, as described with reference to FIGS. 4A and 4B, when the core width of the optical waveguide 13 is increased, generation of unnecessary reflected light in the optical waveguide 13 is suppressed. Therefore, since the mode hop is less likely to occur and the oscillation of the laser is stabilized, the quality of the laser light is improved.

The heater 21 for adjusting the optical length between the mirrors 14 and 15 is provided near the optical waveguide 13 similarly to the configuration illustrated in FIG. 1. In the wavelength tunable laser device 1, the heater 21 may be provided near a normal waveguide portion or near the wide-width waveguide 31. In FIG. 5, the heater 21 is provided near the wide-width waveguide 31. In this case, since the ratio of the wide-width waveguide to the entire waveguide of the optical integrated device increases, reflection from the waveguide decreases, and more stable laser operation can be obtained.

Figure 6:
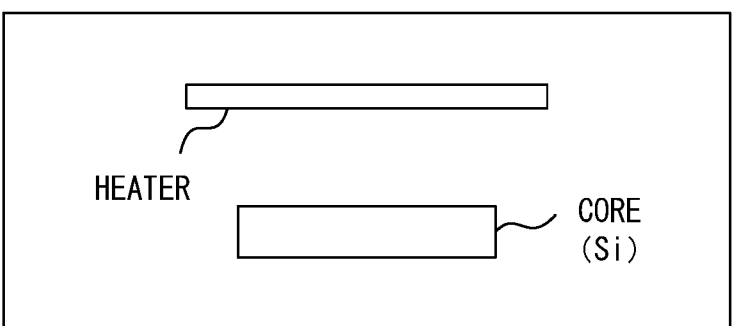
FIG. 6 illustrates an example of arrangement of a wide-width waveguide and a heater.

FIG. 6 illustrates an example of arrangement of a wide-width waveguide and a heater. The structure in the case of providing the heater near the wide-width waveguide may be the same as the structure in the case of providing the heater near the normal waveguide portion illustrated in FIG. 2. In addition, the heater provided near the wide-width waveguide is formed of, for example, a thin film metal, similarly to the heater provided near the normal waveguide portion illustrated in FIG. 2. In the examples illustrated in FIGS. 2 and 6, the widths of the heater provided near the normal waveguide portion and the heater provided near the wide-width waveguide are the same, but the width of the heater provided near the wide-width waveguide may be wider than the width of the heater provided near the normal waveguide portion.

Figure 7A:
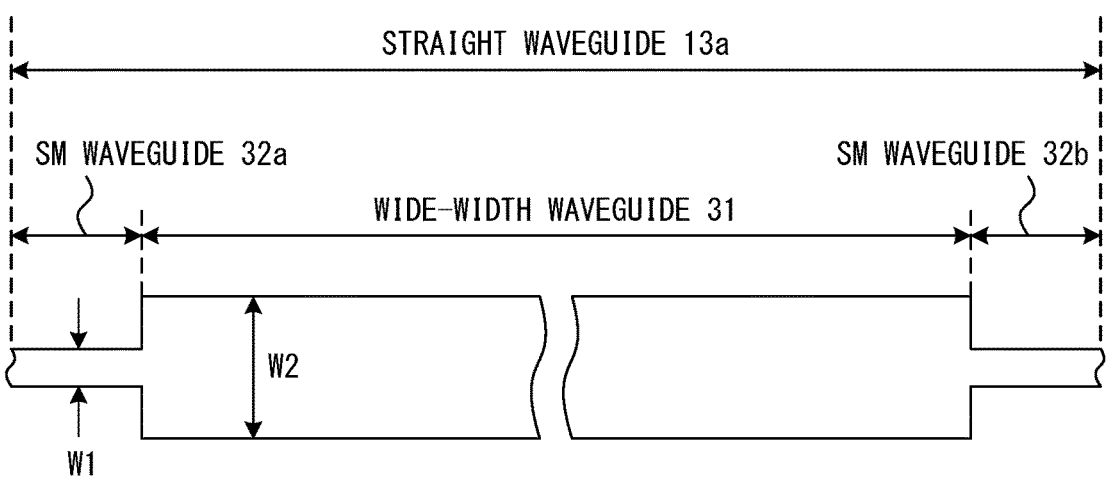
FIGS. 7A and 7B illustrate examples of a structure of the optical waveguide.
Figure 7B:
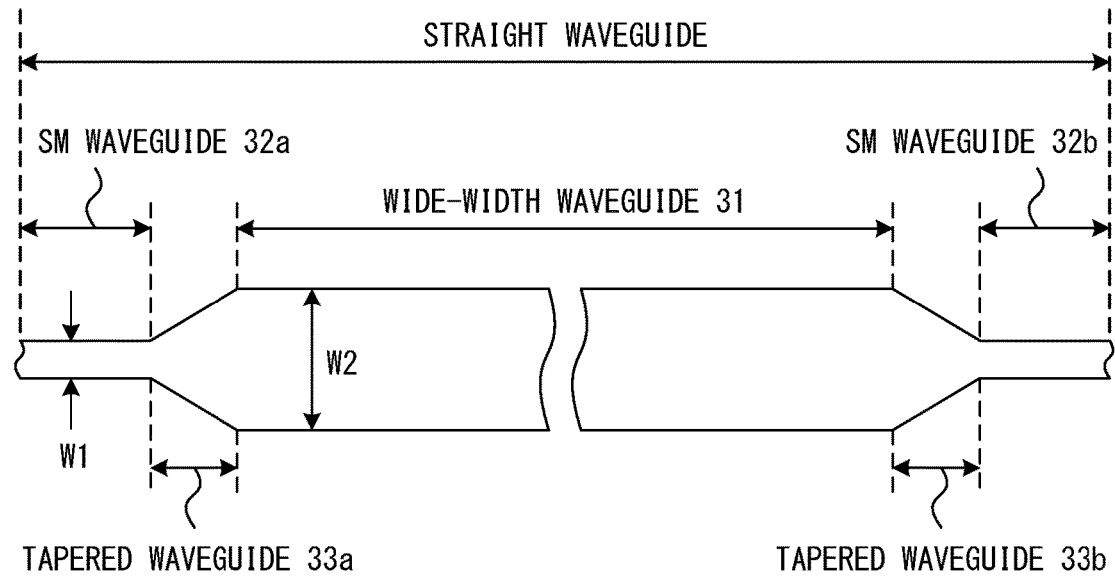

FIGS. 7A and 7B illustrate examples of a structure of the optical waveguide 13. As described above, the optical waveguide 13 includes the straight waveguide 13*a*. In the example illustrated in FIG. 7A, the straight waveguide 13*a* includes the wide-width waveguide 31 and single mode waveguides 32*a* and 32*b*. Here, single mode waveguides 32*a* and 32*b* correspond to the normal waveguide portion. The single mode waveguide 32*a* is connected to one end portion of the wide-width waveguide 31, and the single mode waveguide 32*b* is connected to the other end portion of the wide-width waveguide 31. For example, the single mode waveguide 32*a* is coupled to the optical amplifier 11 via the inclined waveguide 13*b* illustrated in FIG. 5, and the single mode waveguide 32*b* is coupled to the wavelength tunable filter 12 illustrated in FIG. 5.

The width W1 of the cores of the single mode waveguides 32*a* and 32*b* is designed to suppress multimode propagation as described above, and is about 500 nm in this example. The width W2 of the core of the wide-width waveguide 31 is wider than the width W1 of the cores of the single mode waveguides 32*a* and 32*b*, and is about 2 μm in this example. Note that the heights of the wide-width waveguide 31 and the single mode waveguides 32*a* and 32*b* are the same.

As described above, the optical waveguide 13 according to the embodiment of the present invention includes the wide-width waveguide 31. Therefore, as described with reference to FIGS. 4A and 4B, generation of unnecessary reflected light in the optical waveguide 13 is suppressed.

However, in the configuration illustrated in FIG. 7A, the cross-sectional area of the core of the optical waveguide 13 discontinuously changes in the light propagation direction. Specifically, at the boundary between the wide-width waveguide 31 and the single mode waveguide 32*a* and the boundary between the wide-width waveguide 31 and the single mode waveguide 32*b*, the cross-sectional area of the core of the optical waveguide 13 changes discontinuously. When the cross-sectional area of the core of the optical waveguide changes discontinuously in the light propagation direction, not only the loss of light increases but also mode conversion may occur. Therefore, in the configuration illustrated in FIG. 7A, a multimode may occur.

In consideration of this problem, the optical waveguide 13 is preferably formed such that the cross-sectional area of the core continuously changes between the wide-width waveguide 31 and the single mode waveguides 32*a* and 32*b* as illustrated in FIG. 7B. Specifically, a tapered waveguide 33*a* is provided between the wide-width waveguide 31 and the single mode waveguide 32*a*. The width of the core of the tapered waveguide 33*a* continuously changes between W1 and W2. Similarly, a tapered waveguide 33*b* is provided between the wide-width waveguide 31 and the single mode waveguide 32*b*. The width of the core of the tapered waveguide 33*b* continuously changes between W1 and W2. Note that the height of the tapered waveguides 33*a* and 33*b* is the same as that of the wide-width waveguide 31 and the single mode waveguides 32*a* and 32*b*.

As described above, the optical waveguide 13 illustrated in FIG. 7B includes the wide-width waveguide 31 and is formed such that the cross-sectional area of the core continuously changes. Therefore, generation of unnecessary reflected light in the optical waveguide 13 is suppressed, and occurrence of multimode is also suppressed.

Note that, as described with reference to FIGS. 4A and 4B, the wider the width of the wide-width waveguide 31, the weaker the reflected light from the side wall of the optical waveguide. However, as the width of the wide-width waveguide 31 is increased, the multimode is more likely to propagate. Here, the occurrence of the multimode may be suppressed by providing the tapered waveguides 33*a* and 33*b* illustrated in FIG. 7B, but it is difficult to make the multimode zero. That is, when the width of the wide-width waveguide 31 is too wide, the risk of the multimode propagation increases. Therefore, in the embodiment of the present invention, it is preferable to determine the maximum value of the width of the wide-width waveguide 31 in consideration of both the reflected light from the side wall of the core of the optical waveguide and the risk of the multimode propagation.

For example, since it is difficult to make the multimode zero, the maximum value of the width of the wide-width waveguide 31 is 2 μm as an example in order to suppress the propagation of the multimode. On the other hand, when the side wall of the core of the optical waveguide can be smoothly formed, reflected light from the side wall of the core is weak, and thus the width of the wide-width waveguide 31 may be narrower than 2 μm. According to such a design, generation of unnecessary reflected light in the optical waveguide 13 is suppressed, and multimode propagation is also suppressed. As a result, since the oscillation of the laser is stabilized, the quality of the laser light is improved.

Figure 8A:
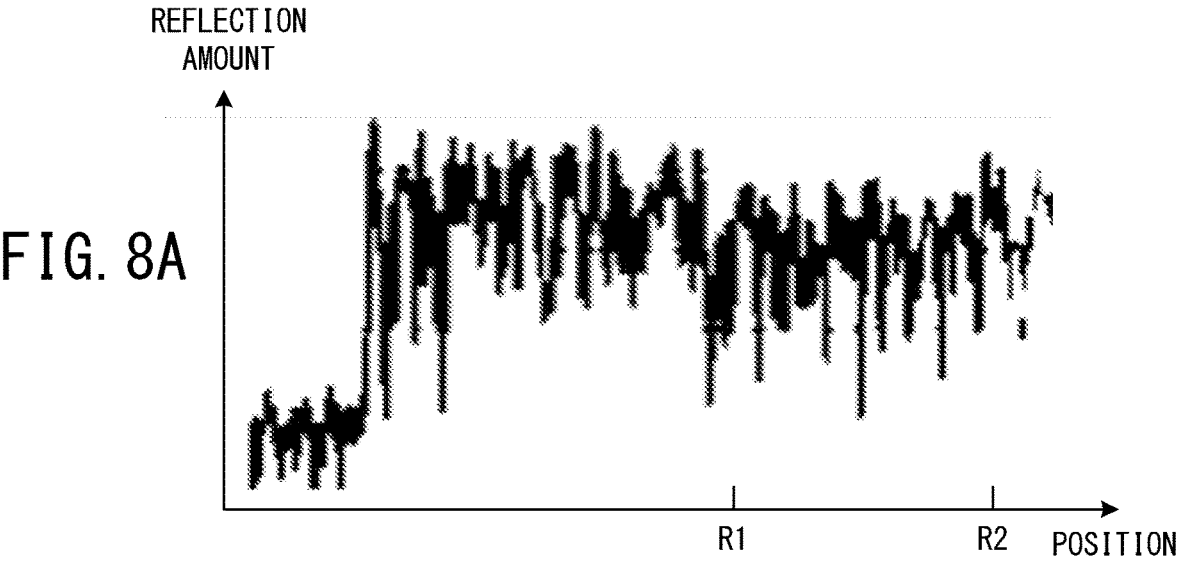
FIGS. 8A-8C illustrate measurement results of reflection from a side wall of a core.
Figure 8B:
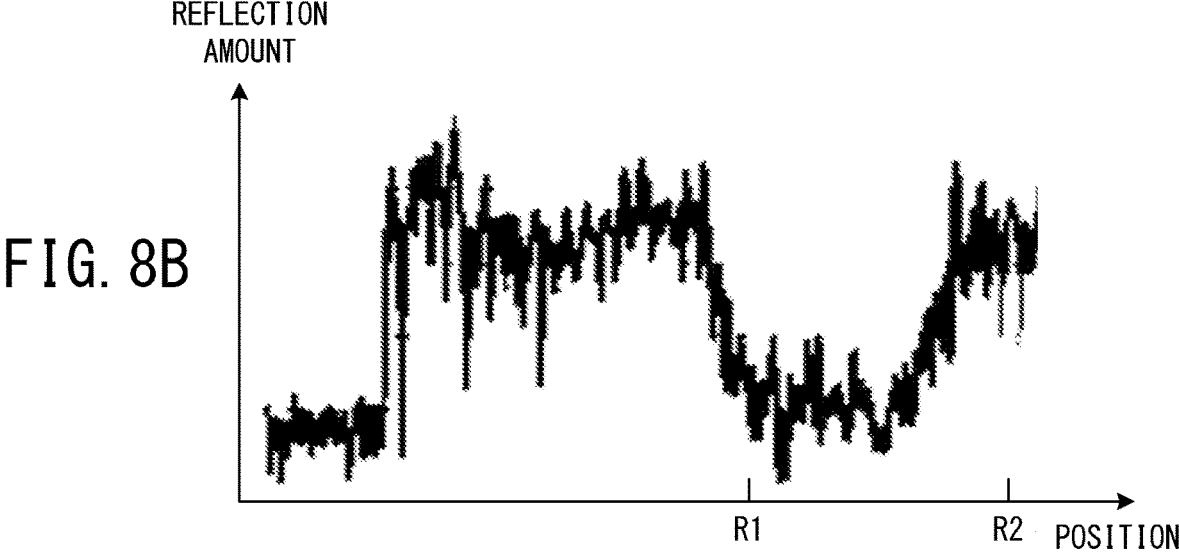
Figure 8C:
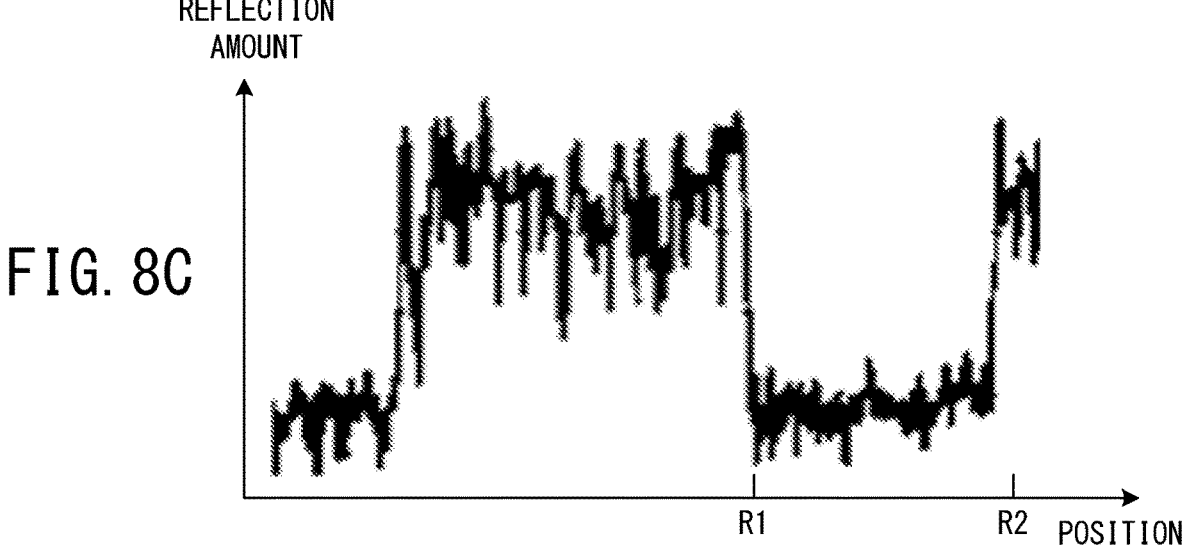

FIGS. 8A-8C illustrate measurement results of reflection from a side wall of a core. The horizontal axis of the graph represents the position on the optical waveguide in the light propagation direction. Positions R1 and R2 each represent an end portion of the wide-width waveguide.

That is, the wide-width waveguides are formed at the positions from R1 to R2. The length (that is, the distance between the positions R1 and R2) of the wide-width waveguide is, for example, 1 mm. In addition, as illustrated in FIG. 7B, tapered waveguides are formed at both ends of the wide-width waveguide. The vertical axis of the graph represents the reflection amount from the side wall of the core. Note that the reflection amount is measured by a reflection measuring instrument (reflectometer).

FIG. 8A illustrates the reflection amount in a case where the width of the core of the wide-width waveguide is slightly wider than the width of the core of the single mode waveguide. FIG. 8B illustrates the reflection amount when the width of the core of the wide-width waveguide is wider than the case illustrated in FIG. 8A and narrower than the case illustrated in FIG. 8C. FIG. 8C illustrates the reflection amount in a case where the width of the core of the wide-width waveguide is sufficiently wide (for example, 2 μm). As described above, when the width of the core of the optical waveguide is increased, reflection (or scattering) from the side wall of the core is suppressed.

Figure 9:
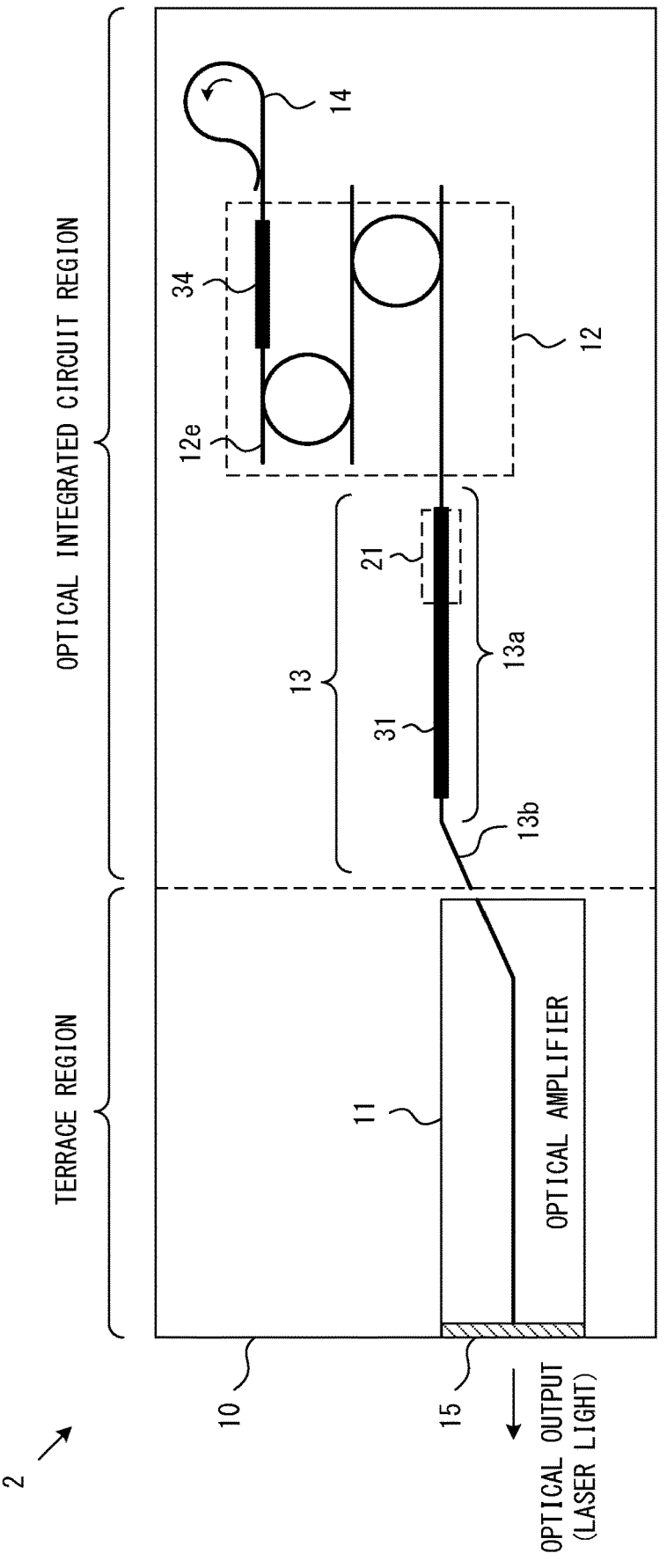
FIG. 9 illustrates a second embodiment of the wavelength tunable laser device.

FIG. 9 illustrates a second embodiment of the wavelength tunable laser device. A wavelength tunable laser device 2 according to the second embodiment is configured by adding a wide-width waveguide 34 to the wavelength tunable laser device 1 illustrated in FIG. 5.

As described above, by increasing the width of the core of the optical waveguide, reflection from the side wall of the core is suppressed. Therefore, in order to reduce reflection from the side wall of the core, it is preferable to form the wide-width waveguide as long as possible in the optical path between the mirrors 14 and 15. However, when the width of the core of the curved waveguide is increased, propagation light of a higher-order mode is pumped, and as a result, there is a risk that a loss of light increases. Thus, for example, it is not preferable to widen the width of the core of the ring waveguide in the wavelength tunable filter 12. Therefore, in the embodiment of the present invention, a width of a core of each of the ring waveguides 12a and 12b is the same as that of a normal waveguide portion (for example, a single mode waveguide).

According to this consideration, the wavelength tunable laser device 2 is configured such that the waveguide 12e in the wavelength tunable filter 12 includes a wide-width waveguide 34. For this configuration, in the wavelength tunable laser device 2, as compared with the wavelength tunable laser device 1 illustrated in FIG. 5, it is considered that the total length of the wide-width waveguide increases, and reflection from the side wall of the core decreases.

However, as the number of wide-width waveguide increases, the number of conversions between a normal waveguide (in FIGS. 7A and 7B, single mode waveguides 32a and 32b) and a wide-width waveguide increases. Here, a tapered waveguide illustrated in FIG. 7B can be provided between the normal waveguide and the wide-width waveguide in order to suppress loss and/or mode conversion. However, even in the case of providing a tapered waveguide, it is not easy to realize complete waveguide width conversion, and loss and/or mode conversion may occur.

Therefore, the wavelength tunable laser device according to the embodiment of the present invention preferably satisfies the following two requirements. (1) The wide-width waveguide is formed as long as possible in the optical path between the mirrors 14 and 15. (2) The number of wide-width waveguide is reduced.

Figure 10A:
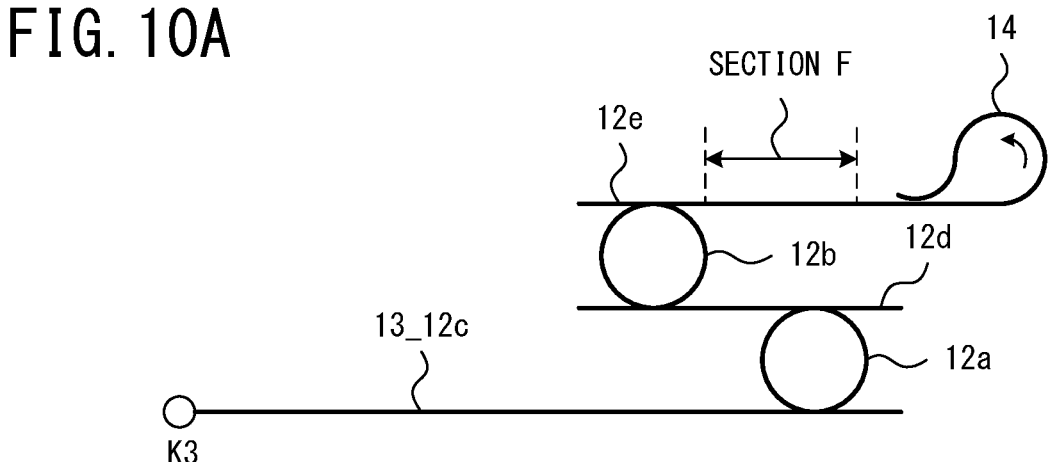
FIGS. 10A and 10B are diagrams for explaining layouts of the wavelength tunable filter and a mirror.
Figure 10B:
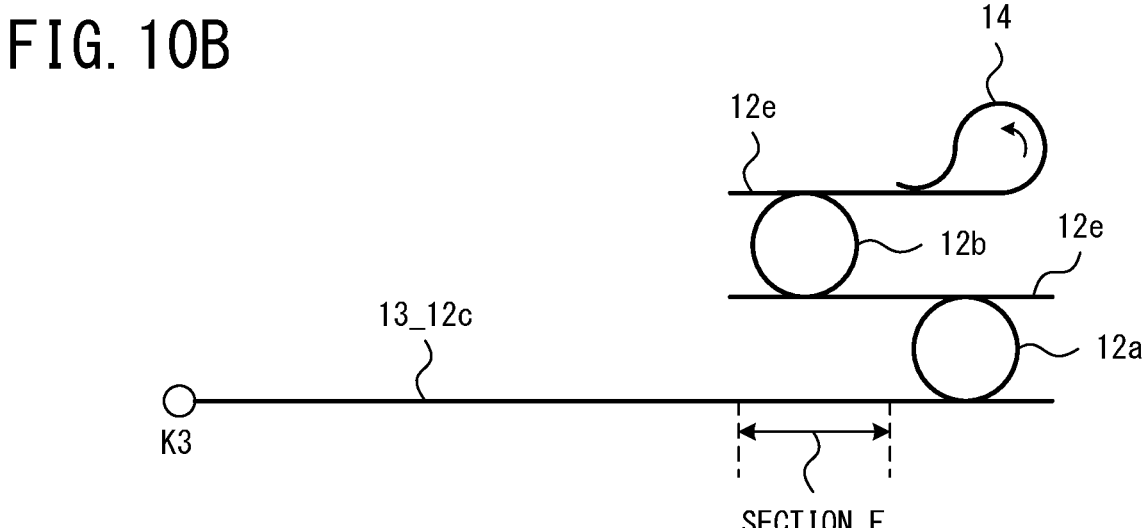

FIGS. 10A and 10B are diagrams for explaining layouts of the wavelength tunable filter 12 and the mirror 14. In FIGS. 10A and 10B, the optical waveguide 13 and the waveguide 12c configure one optical waveguide. Therefore, in the description relating to FIGS. 10A and 10B, this optical waveguide may be referred to as "waveguide 13_12c".

The layout illustrated in FIG. 10A corresponds to the wavelength tunable laser device 2 illustrated in FIG. 9. That is, the wide-width waveguide 34 illustrated in FIG. 9 is formed in a section F illustrated in FIG. 10A. In this case, the wavelength tunable laser device 2 includes two wide-width waveguides.

In the layout illustrated in FIG. 10B, the positions of the ring waveguides 12a and 12b are moved to the side of the mirror 14 as compared with the layout illustrated in FIG. 10A. Specifically, the positions of the ring waveguides 12a and 12b are shifted such that the distance between the ring waveguide 12b and the mirror 14 is as small as possible. At this time, the position of mirror 14 does not change. Therefore, as compared with the layout illustrated in FIG. 10A, the waveguide 13_12c becomes longer by a length corresponding to the section F.

As described above, in the layout illustrated in FIG. 10B, as compared with the layout illustrated in FIG. 10A, in the optical path between a point K3 and the mirror 14, the length of the waveguide 12e is shortened by the section F, and the length of the waveguide 13_12c is made longer by the section F. That is, the optical length between the point K3 and the mirror 14 is the same.

Figure 11:
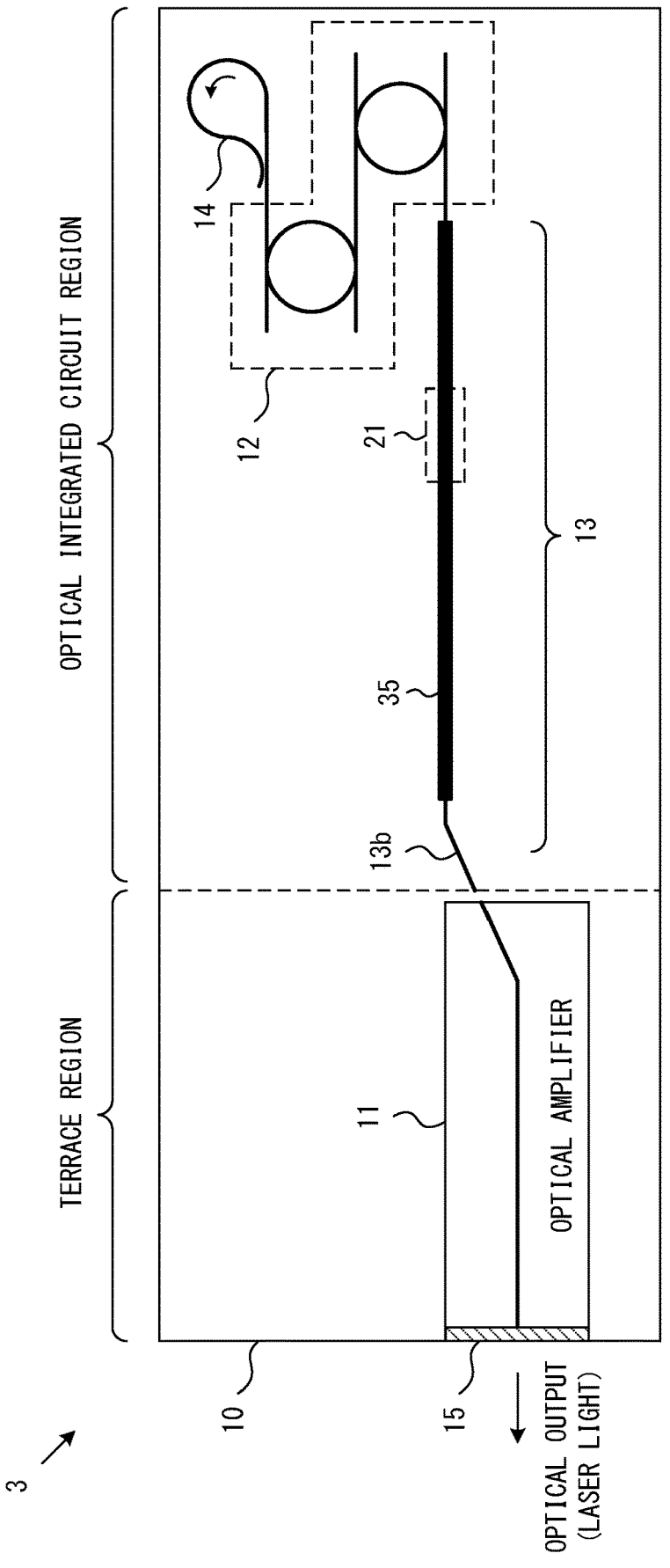
FIG. 11 illustrates a third embodiment of the wavelength tunable laser device.

FIG. 11 illustrates a third embodiment of the wavelength tunable laser device. A wavelength tunable laser device 3 according to the third embodiment includes a wide-width waveguide 35 between the optical amplifier 11 and the wavelength tunable filter 12. Here, the wavelength tunable filter 12 is formed based on the layout illustrated in FIG. 10B. In addition, in the wavelength tunable laser device 3, the wide-width waveguide 34 illustrated in FIG. 9 is not formed, and the wide-width waveguide is formed in the section F illustrated in FIG. 10B. Note that the wide-width waveguide formed in the section F illustrated in FIG. 10B is a part of the wide-width waveguide 35.

The length of the wide-width waveguide 35 is equal to or greater than the sum of the length of the wide-width waveguide 31 and the length of the wide-width waveguide 34 illustrated in FIG. 9. Therefore, the above requirement (1) is satisfied. In addition, in the wavelength tunable laser device 3 illustrated in FIG. 11, the number of wide-width waveguides is One. Therefore, the above requirement (2) is also satisfied. As a result, it is possible to suppress loss and/or mode conversion caused by providing the wide-width waveguide while suppressing generation of unnecessary reflected light in the optical waveguide 13.

Figure 12:
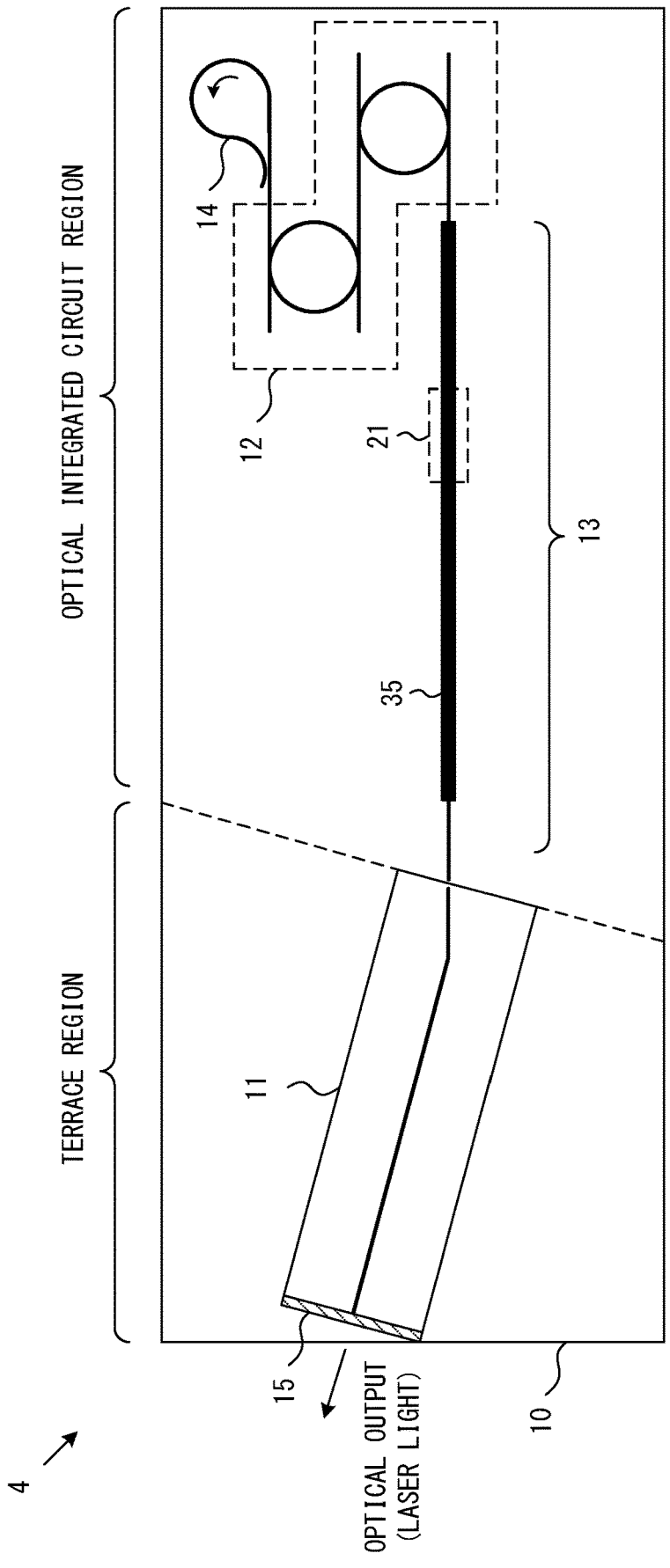
FIG. 12 illustrates a fourth embodiment of the wavelength tunable laser device.
Figure 13:
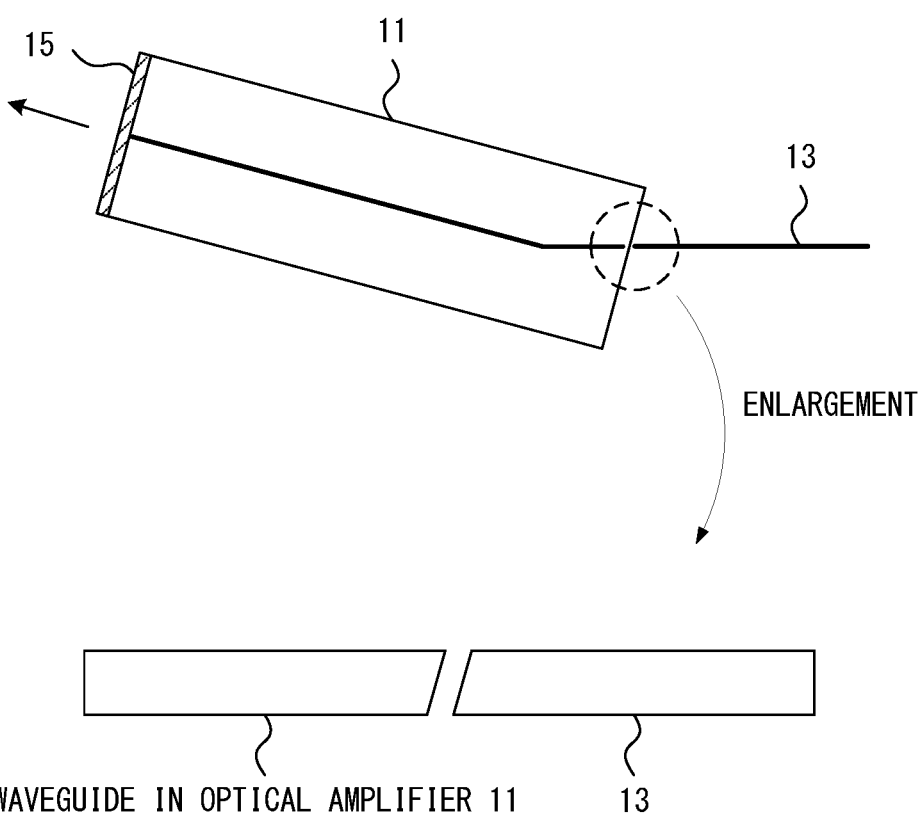
FIG. 13 illustrates an example of a connection surface between a waveguide of an optical amplifier and a waveguide of an optical integrated circuit.

FIG. 12 illustrates a fourth embodiment of the wavelength tunable laser device. In a wavelength tunable laser device 4 according to the fourth embodiment, the optical amplifier 11 is formed obliquely with respect to the longitudinal direction of the silicon substrate 10. In addition, as illustrated in FIG. 13, a connection surface between the waveguide in the optical amplifier 11 and the optical waveguide 13 is formed obliquely with respect to the light propagation direction. In this case, the path from the connection portion with the optical amplifier 11 to the wide-width waveguide 35 is entirely formed by a straight waveguide, and does not include a bent waveguide having a normal width. Therefore, according to this configuration, since the ratio of the wide-width waveguide to the entire waveguide of the optical integrated device increases, reflection from the waveguide decreases, and more stable laser operation can be obtained.

Figure 14:
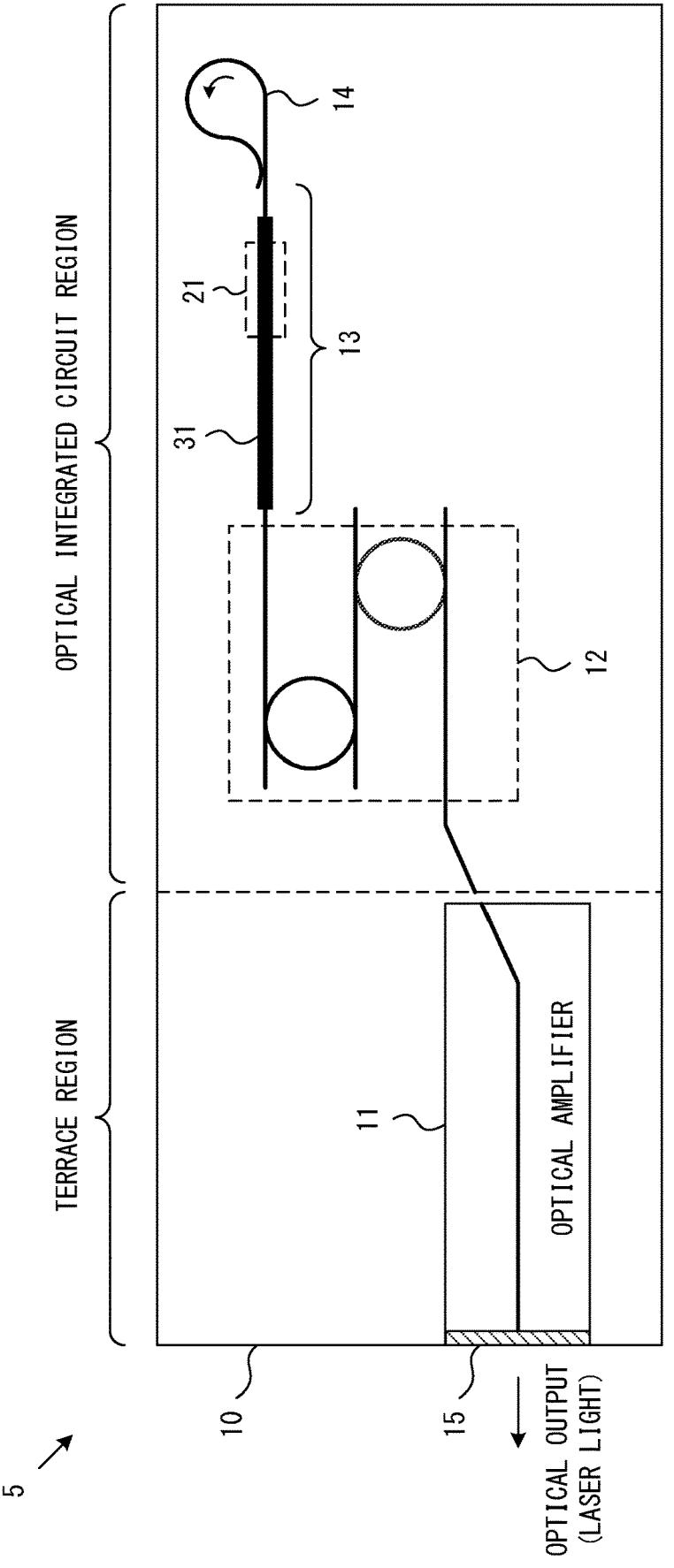
FIG. 14 illustrates a fifth embodiment of the wavelength tunable laser device.

FIG. 14 illustrates a fifth embodiment of the wavelength tunable laser device. In the first to fourth embodiments, a wide-width waveguide is formed between the optical amplifier 11 and the wavelength tunable filter 12. On the other hand, in a wavelength tunable laser device 5 according to the fifth embodiment, the optical waveguide 13 formed between the wavelength tunable filter 12 and the mirror 14 includes the wide-width waveguide 31. Even with this configuration, as in the first to fourth embodiments, unnecessary reflected light generated in the optical waveguide is suppressed, and the quality of the laser light is improved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. A wavelength tunable laser device comprising:
a first mirror;
a second mirror;
an optical amplifier provided between the first mirror and the second mirror;
a wavelength tunable filter provided between the first mirror and the second mirror; and
an optical waveguide coupling the optical amplifier and the wavelength tunable filter,
wherein the optical waveguide includes a first waveguide formed with a first width and a second waveguide formed with a second width wider than the first width, the wavelength tunable filter is configured to transmit light generated by the optical amplifier to the second mirror and output the light reflected from the second mirror to the optical amplifier, the optical amplifier is configured to amplify the light output from the wavelength tunable filter and output the amplified light to the first mirror, and the first mirror is configured to output the light output from the optical amplifier as a laser light.

2. The wavelength tunable laser device according to claim 1, wherein
the second waveguide is a straight waveguide.

3. The wavelength tunable laser device according to claim 1, wherein a tapered waveguide is provided between the first waveguide and the second waveguide, in which a width of the tapered waveguide at a first end portion connected to the first waveguide is the first width, a width of the tapered waveguide at a second end portion connected to the second waveguide is the second width, and a width of the tapered waveguide continuously changes between the first end portion and the second end portion.

4. The wavelength tunable laser device according to claim 1, further comprising:
an electric circuit that changes a refractive index of the optical waveguide to adjust an optical length between the first mirror and the second mirror.

5. The wavelength tunable laser device according to claim 4, wherein
the electric circuit changes a refractive index of the second waveguide.

6. The wavelength tunable laser device according to claim 1, wherein
the wavelength tunable filter includes
a ring waveguide, and
a third waveguide coupling the ring waveguide and the second mirror, and
at least a part of the third waveguide is formed with the second width.

7. The wavelength tunable laser device according to claim 1, wherein
the second waveguide formed with the second width is only the second waveguide.

8. The wavelength tunable laser device according to claim 1, wherein
a connection surface between a waveguide in the optical amplifier and the optical waveguide is formed obliquely with respect to a direction of light propagating through the second waveguide.

9. A wavelength tunable laser device comprising:
a first mirror;
a second mirror;
an optical amplifier provided between the first mirror and the second mirror;
a wavelength tunable filter provided between the first mirror and the second mirror and coupled to the optical amplifier; and
an optical waveguide coupling the wavelength tunable filter and the second mirror,
wherein the optical waveguide includes a first waveguide formed with a first width and a second waveguide formed with a second width wider than the first width, the wavelength tunable filter is configured to transmit light generated by the optical amplifier to the second mirror and output the light reflected from the second mirror to the optical amplifier, the optical amplifier is configured to amplify the light output from the wavelength tunable filter and output the amplified light to the first mirror, and the first mirror is configured to output the light output from the optical amplifier as a laser light.

* * * * *